United States Patent [19]

Werner

[11] 3,918,042

[45] Nov. 4, 1975

[54] DELTA MODULATOR HAVING INCREASED DYNAMIC RANGE

[75] Inventor: Richard E. Werner, Hanover Park, Ill.

[73] Assignee: Motorola, Inc., Chicago, Ill.

[22] Filed: Apr. 29, 1974

[21] Appl. No.: 464,870

[52] U.S. Cl. ....... 340/347 AD; 325/38 R; 332/38 D

[51] Int. Cl.[2] .......................................... H03K 13/06

[58] Field of Search ................. 325/38 R; 332/38 D; 340/347

[56] References Cited

UNITED STATES PATENTS

| | | | |
|---|---|---|---|
| 3,533,098 | 10/1970 | Munoz | 340/347 AD |
| 3,582,784 | 6/1971 | Gaunt | 325/38 |
| 3,676,600 | 7/1972 | Kaneko et al. | 179/15.55 T |
| 3,699,566 | 10/1972 | Schindler | 340/347 AD |

*Primary Examiner*—Malcolm A. Morrison
*Assistant Examiner*—Vincent J. Sunderdick
*Attorney, Agent, or Firm*—Eugene A. Parsons; James W. Gillman

[57] ABSTRACT

Delta modulator wherein a digital output signal is produced from an analog modulating signal, with the digital signal being filtered and compared with the modulating signal to produce an error signal for controlling the modulator, and wherein the filtered digital signal is fed back to the comparator through a nonlinear circuit which decreases the amplitude of small amplitude signals being fed back. The nonlinear circuit may have a first linear response portion for translating signals below the normal threshold of the modulator, and a second linear response portion for signals above the normal threshold, with the gain of the second portion being substantially greater than that of the first portion. Since the signal fed back is smaller than it would otherwise be for weak signal conditions, less input signal is required to establish adequate error voltage to operate the delta modulator, thus extending the dynamic range to signal levels too weak to operate a known delta modulator. The nonlinear circuit may include first and second parallel paths, with a transistor stage in one path having means rendered operative at a given signal level to limit the output, so that at low signal levels the signal is translated without substantial attenuation and at high signal levels the signal is attenuated. The signal in the path including the transistor stage acts to cancel a portion of the signal in the other path to control the signal fed back from the filter to the comparator, to increase the signal fed back at high level digital outputs.

9 Claims, 5 Drawing Figures

DELTA MODULATOR HAVING INCREASED DYNAMIC RANGE

BACKGROUND OF THE INVENTION

Various attempts have been made to increase the effective dynamic range of delta modulation systems. One system which has been used applies a gain control to the amplifier for the modulation signal, ahead of the delta modulator, to compress the range of the modulation signal. This action is compensated for by a complementary gain controlled amplifier which follows the demodulator to expand the received signal back to the full range of dynamic expression. This system, rather than increasing the dynamic range of the delta modulator, actually reduces the dynamic range of the modulation signal so that it can be handled by the delta modulator. This system has the disadvantage that it has time constants, and as it does not operate instantaneously it permits overshoot of the modulation signal. Similar systems have been used which do not include time constants and therefore do not cause delay. However, these systems require critical matching of the nonlinearities. In systems with low clock rates, quantizing noise appears between the complementary nonlinearities and causes intermodulation with the signal to produce additional modulation noise.

Systems of adaptive delta modulation have been used which adjust the quantizing step size in accordance with signal level to achieve the effect of compression in the delta modulator and expansion in the demodulator. These systems are quite complex and have not been suitable for use with low clock rates. It has also been proposed to add noise to the input signal so that the noise is sufficient to break up the idle pattern of the delta modulator, and thus provide a modulation output. Although any signal, however small, will then influence the output of the delta modulator, the presence of the additional noise is objectionable.

SUMMARY OF THE INVENTION

It is an object of the present invention to provide a delta modulator wherein the dynamic range capability is increased.

Another object of the invention is to provide a system which operates instantaneously to increase the dynamic range of a delta modulator.

A further object of the invention is to provide a delta modulator with instantaneously operating dynamic range extension which can be simply implemented.

Still another object of the invention is to provide a delta modulator having a monlinear element in the feedback path which decreases the feedback factor for low amplitude signals with respect to high amplitude signals to thereby increase the dynamic range of the delta modulator.

A still further object of the invention is to provide a delta modulator with a feedback circuit including first and second paths, wherein signals in the two paths substantially cancel at low signal levels and the signal in one path is limited at high signal levels so that it does not cancel the signal in the other path to thereby increase the feedback signal at high signal levels.

In practicing the invention, a delta modulator is provided wherein the analog modulating signal is applied through a comparator to a digital generator which produces the digital output. The digital generator may be a flip-flop having two output levels and to which a clock pulse is applied, with the clock rate being relatively low such as 12 kilohertz for an audiomodulating signal having frequencies up to several kilohertz. The digital output is fed back through a filter and a nonlinear element to the second, inverting, input of the comparator. The filter may be a simple integrating circuit or a more complex circuit which provides a greater dynamic range from the digital delta modulation signal. The nonlinear element preferably has a characteristic which provides low gain for signals below the normal threshold level of the delta modulator and high gain for signals above the normal threshold to provide increased dynamic range in the delta modulator. The nonlinear element may include a first direct transmission path and a second inverting path including a transistor stage. The inverting path substantially cancels the signals in the direct path at low signal levels. The transistor stage includes means for limiting the output, such as clipping diodes, so that at higher signal levels the output from the transistor stage will not increase and will not cancel the increased signal in the direct transmission path. This especially reduced feedback voltage for low level signals permits weaker input signals to control the comparator and effect modulation. Excessive modulation under strong signal conditions is avoided by the restoration of normal amounts of feedback. Thus the delta modulator will respond to a greater dynamic range of input signals.

The term "normal threshold" is used in this specification to mean the threshold of a known delta modulator which does not have a nonlinear element as described in this specification in the feedback path.

DETAILED DESCRIPTION

Figure 1:
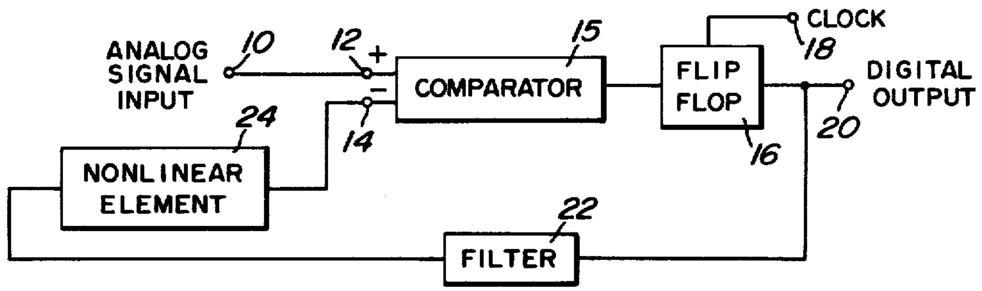
FIG. 1 is a block diagram of a delta modulator in accordance with the invention.

FIG. 1 shows in block diagram form the delta modulator of the invention. The modulating signal, which may be an analog audio signal, is applied at input terminal 10. This signal is applied to a first input 12 of comparator 15. The comparator controls a flip-flop circuit 16 to which clock pulses are applied from terminal 18. The flip-flop 16 produces an output having one of two levels when a clock pulse is applied thereto, with the output level being determined by the polarity of the input from the comparator 15. When the input to the flip-flop 16 is of one polarity the lower level output is produced, and when the input is of the opposite polarity the higher level output is produced. The output of the flip-flop is a train of digital pulses occurring at a regular rate, with the adjacent pulses being at the higher level when a signal of one polarity is continuously applied thereto and at the lower level when the signal polarity is reversed.

The pulse train from the flip-flop 16 is applied to output terminal 20. The pulse output of flip-flop 16 is also applied to filter 22, which may include an integrator to provide an output which varies with the average amplitude of the pulse wave applied thereto. This may be a filter having a special integration characteristic as described in patent application Ser. No. 380,784, filed July 19, 1973 by James A. MacDonald. The output of filter 22 is applied to the nonlinear translating circuit 24 which applies a signal to the second inverting input 14 of the comparator 15. The difference between the input signal voltage appearing at comparator input 12 and the feedback signal appearing at comparator input 14 forms an error signal which determines the polarity of the output of the comparator 15.

Considering the operation of the delta modulator, when the instantaneous voltage of the input analog signal applied to input 12 of the comparator is more positive than the signal which is fed back and applied to the second comparator input 14, the comparator output will cause the flip-flop 16 to produce a high level output pulse when triggered by the clock. If the instantaneous voltage of the input signal continues to rise at a faster rate than the signal which is fed back, the signal at input 12 will remain more positive than the signal fed back so that the output of the flip-flop 16 will remain high. When the instantaneous voltage of the input signal at terminal 12 remains constant or drops, this will fall below the signal fed back, and the output of the comparator applied to the flip-flop 16 will produce the low level output. If the comparator is essentially balanced when no input analog signal is applied, the high and low level outputs will alternate to produce an idle pattern which has a frequency of 6 kHz for a clock rate of 12 kHz. This condition is maintained so long as the signal fed back to comparator input 14 is alternately more positive and more negative than comparator input 12.

The nonlinear element 24 translates the signal applied thereto in a generally linear manner until the signal reaches a particular amplitude. This may be selected to be at or near the normal threshold of the delta modulator. Above this particular amplitude the signal is translated in a linear manner, but at a higher gain. The idle pattern at the input to the nonlinear element 24, occurring when there is no signal present, is of low level due to the frequency response characteristic of the filter 22. This idle pattern falls into the low gain region of nonlinear element 24 so that the magnitude of the idle pattern fed to comparator input 14 is less than would otherwise exist. Thus less signal strength is required at comparator input 12 to seize control and effect modulation. The digital output at terminal 20 is demodulated by filter 22 and nonlinear element 24 to provide an approximation to the input signal.

Figure 2:
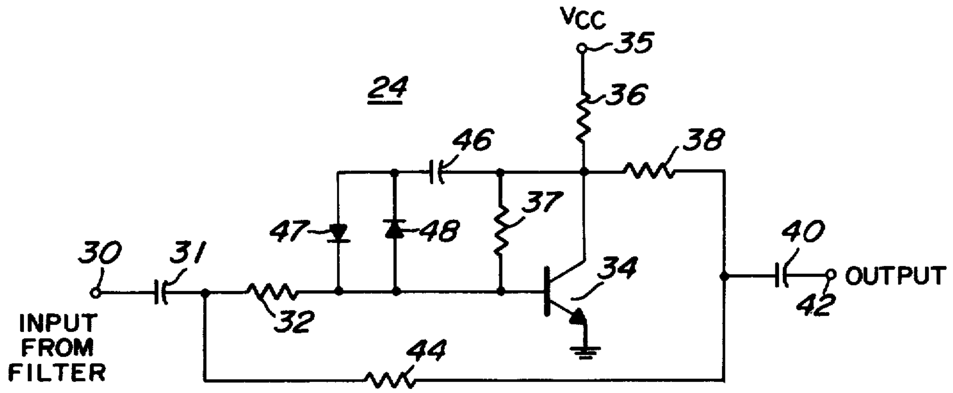
FIG. 2 is a circuit diagram of the nonlinear element used in the modulator of FIG. 1.

FIG. 2 shows a circuit which may be used as the nonlinear element 24 in the delta modulator system of FIG. 1. The output from the filter 22 is applied to input terminal 30. This signal is applied through capacitor 31 and resistor 32 to the base of transistor 34. Transistor 34 is biased from a supply potential 35 by resistor 36 connected to the collector electrode, and by resistor 37 connected in series with resistor 36 to the base electrode. The output from the collector electrode is applied through resistor 38 and capacitor 40 to the output terminal 42. Resistor 44 provides a path for signals from the input terminal 30 through capacitor 31, which path is completed through capacitor 40 to the output terminal 42. The output terminal 42 is connected to the inverting input 14 of the comparator 15 in the system of FIG. 1.

In the circuit of FIG. 2, when the input signal at terminal 30 is small, the transistor 34 will operate to provide an output signal which is the inversion of the input signal. This acts to partially cancel the signal from the filter applied through capacitor 31, resistor 44 and capacitor 40 to the output terminal 42. Accordingly, only a small signal will be applied to input 14 of comparator 15. When the input signal exceeds a predetermined value, which as stated above can be the level of the idle pattern from filter 22 of the delta modulator, the signal developed at the collector electrode of transistor 34 and applied through capacitor 46 to the oppositely connected diodes 47 and 48 will be sufficient to render the diodes conducting. This will limit the voltage at the collector electrode of the transistor 34 so that this voltage remains substantially constant. Accordingly, as the signal level applied to the input terminal 30 increases, the signal at the collector electrode which is applied through resistor 38 to the output terminal 42 will not increase. This signal will cancel only a part of the larger signal applied through resistor 44 to the output terminal 42. As the signal level increases, the transistor output will cancel a progressively smaller portion of the signal applied through resistor 44 from the filter 22, so that the output of element 24 applied at the inverting input terminal 14 of the comparator 15 will increase.

Figure 3:
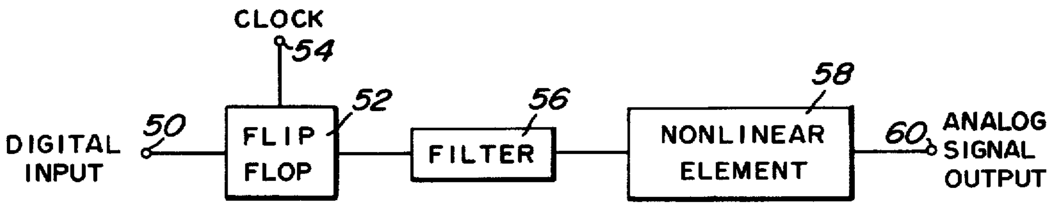
FIG. 3 is a block diagram of a delta demodulator which may be used in a system with the delta modulator of FIG. 1.

FIG. 3 shows in block diagram form a delta demodulator circuit which can be used in a communication system with the delta modulator of FIG. 1. The digital signal produced by the delta modulator of FIG. 1 can be transmitted from output terminal 20 thereof to input terminal 50 of the delta demodulator by any suitable transmission means. The digital signal is applied from terminal 50 to flip-flop circuit 52 to which a clock input is applied at terminal 54. The clock used for the flip-flop 52 of the demodulator must operate at the same rate as the clock applied to the flip-flop in the modulator and be properly phased with respect to the incoming digital signal so that it serves to reconstruct a proper digital waveform from the received signal which may have undergone various distortions during transmission. The output of the flip-flop 52 is applied to filter 56 which preferably has the same characteristics as the filter 22 of the modulator in FIG. 1. The output of the filter 56 is applied to nonlinear element 58 which may have the same characteristics as the element 24 in the modulator of FIG. 1. It may be desired to provide an element having different characteristics from that of element 24 to take care of special circumstances. The output of the nonlinear element produces the analog modulating signal or audio signal at output terminal 60.

Figure 4:
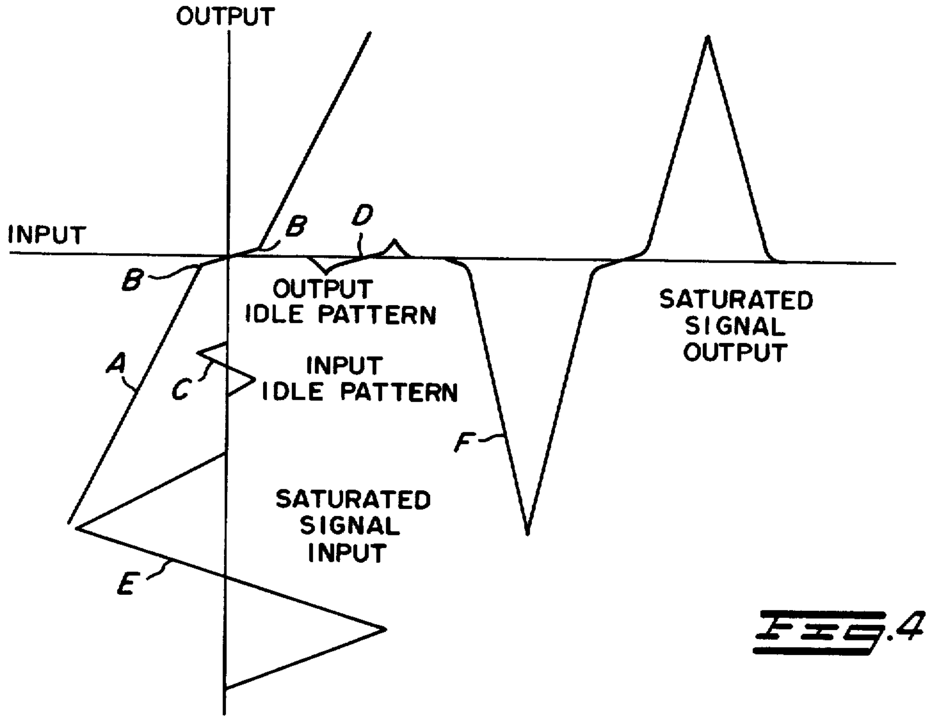
FIG. 4 illustrates the transfer characteristics of the nonlinear element of FIG. 2.

FIG. 4 shows the transfer characteristic of the nonlinear circuit shown in FIG. 2. Curve A shows the transfer characteristic, which has a very small slope for small input signals and a large slope for larger input signals. The knees or corners B of the curve are approximately at the original threshold of the delta modulator, and form junctions between the low gain center portion and the high gain outer portions. The output pulse wave of the delta demodulator when no signal is applied, commonly referred to as the idle pattern, produces an output from the filter 22 as shown by wave C in FIG. 4. Such a wave when applied to the nonlinear circuit of FIG. 2, will produce an output wave as shown by curve D. The peaks of the wave of curve C may extend beyond the corners B and produce peaks in the output wave of the nonlinear element as shown by the curve D. Since the threshold of signal sensitivity of the delta modulator is proportional to the magnitude of the idle pattern voltage fed back, it is apparent that the nonlinear element will reduce the idle pattern voltage to lower the signal threshold voltage.

The digital output for a large amplitude modulating signal will produce an output wave from the filter 22 as shown by curve E in FIG. 4. This saturated signal input will produce an output from the nonlinear circuit as shown by curve F. As the input signal increases in either direction from zero, the output will be small initially because of the small slope of the transfer characteristic between the points B. When the signal reaches these points, the output will increase to provide a high amplitude output, as shown by curve F in FIG. 4.

Figure 5:
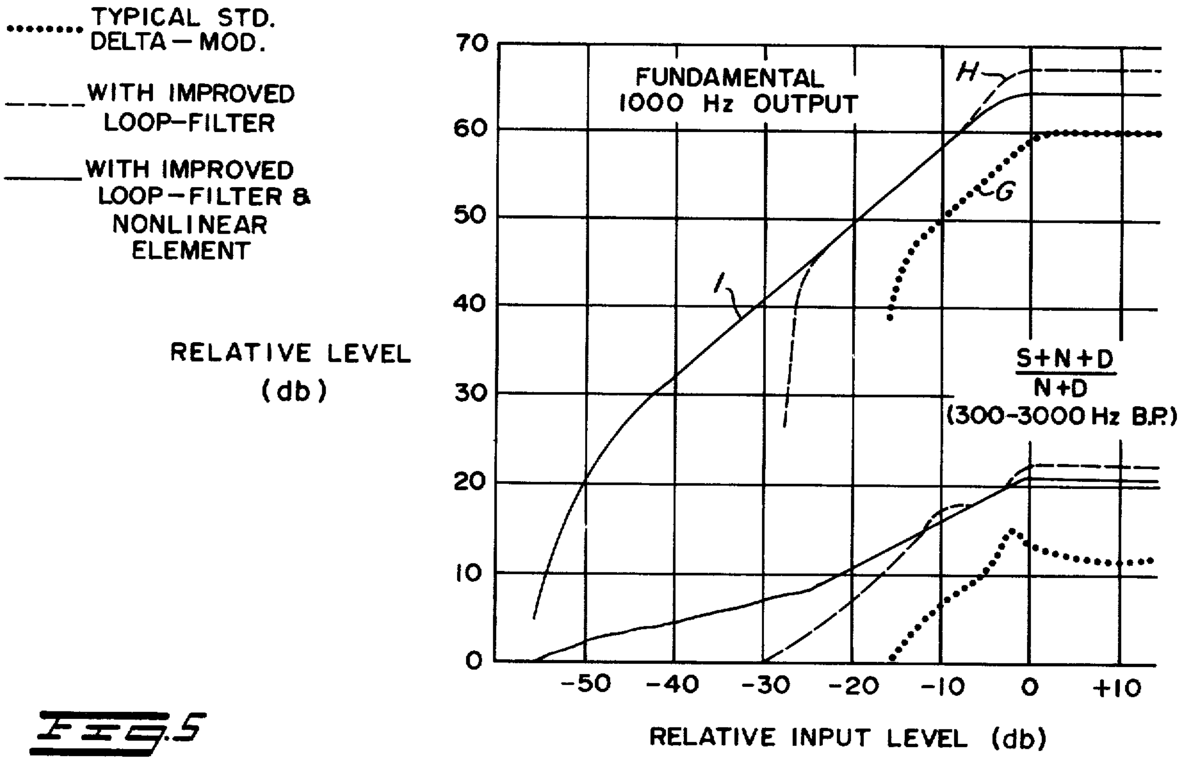
FIG. 5 shows the extension of dynamic range of the delta modulator of the invention.

The performance of the delta modulator as shown in FIG. 1, in combination with the demodulator of FIG. 3, for a signal at 1,000 hertz and a clock rate of 12 kHz is shown in FIG. 5. The dotted response curve G shows the response of the standard delta modulator wherein the filter 22 is a simple integrator and the nonlinear element 24 is not used. The dashed curve H shows the response when the special loop filter of application Ser. No. 380,784 is used. The solid curve I shows the response of the modulator of the invention.

The upper set of curves displays the level of the fundamental 1000 cps component of the output signal as a function of input signal level. The lower set of curves displays the ratio of total output signal (including noise and distortion) to the noise and distortion contained in the output as a function of input signal level for a system which has a bandpass from 300 to 3000 Hz. This lower set of curves is therefore an indication of the quality of the demodulated signal. The three lower curves represent the same delta modulation systems as the upper curves and are indicated in the same way.

It is apparent from FIG. 5 that the system of the invention provides a substantial reduction of the input threshold, as compared to a typical known delta modulator. Also the noise and distortion characteristics for low level signals is improved. The overall dynamic range of the system has been increased to provide a range of the order of 45 decibels. This represents a significant improvement over known delta modulators. The nonlinear element used in the system of the invention is of simple and inexpensive construction and is not critical of adjustment.

I claim:

1. A delta modulator for developing a digital signal in response to a modulating signal, including in combination:

comparator means having input means and an output, said comparator means producing a signal at said output representing the difference between signals applied at said input means, means applying a modulating signal to said input means of said comparator means, digital signal generation means coupled to said output of said comparator means and responsive to the signal therefrom for producing a digital signal, and feedback means coupled between said digital signal generation means and said input means of said comparator means and including filter means and nonlinear translating means, said filter means being connected to the output of said digital signal generation means and producing a signal varying with the average amplitude of said digital signal, said nonlinear translating means being connected to receive the signal from said filter means and producing a modified feedback signal having reduced amplitude in response to a signal from said filter means which is below a predetermined value and said translating means being connected to said input means of said comparator means.

2. A delta modulator according to claim 1 wherein said comparator means has first and second inputs, one of which inverts the signal applied thereto, with said modulating signal being applied to said first input and said modified feedback signal being applied to said second input, said comparator producing an output of one polarity in response to a modulating signal which is more positive than the modified feedback signal and producing an output of the opposite polarity in response to a modulating signal which is more negative than the modified feedback signal.

3. A delta modulator according to claim 2 wherein said digital signal generation means includes means responsive to clock pulses for producing output signals of first and second levels, said signal generation means producing an output of said first level in response to a signal from said comparator means of one polarity and producing an output signal of said second level in response to a signal from said comparator means of opposite polarity.

4. A delta modulator according to claim 1 wherein said nonlinear translating means includes means forming first and second signal paths connected in parallel, with said first signal path including means for inverting the signal therein to cancel at least a portion of the signal in said second signal path.

5. A delta modulator in accordance with claim 4 wherein said nonlinear translating means includes means in said first path which inverts the signal, and limiting means for limiting the amplitude of the signal in said first path to a predetermined value, whereby at low signal levels the signal in said first path substantially cancels the signal in said second path and at high signal levels the signal in said first path is limited and cancels only a portion of the signal in said second path.

6. A delta modulator in accordance with claim 5 wherein said means in said first path which inverts the signal includes a transistor.

7. A communication system for translating an analog input signal to a digital signal, for transmission of the digital signal, and for translating the digital signal into an analog output signal, including in combination, a delta modulator including comparator means having input means for receiving the analog input signal and an output, digital signal generation means coupled to said output of said comparator means and responsive to the signal therefrom for producing a digital signal, and feedback means coupled between said digital signal generation means and said input means and including filter means and nonlinear translating means, said filter means being connected to the output of said digital signal generation means and producing a signal varying with the average amplitude of said digital signal, said nonlinear translating means being connected to receive the signal from said filter means and producing a modified feedback signal which has a reduced amplitude in response to a signal from said filter means which is below a predetermined value and said translating means being connected to said input means of said comparator means, transmission means for translating said digital signal, and a delta demodulator coupled to said transmission means and including signal restoring means for restoring the digital signal produced by said digital modulator, filter means for producing a signal varying with the average amplitude of said digital signal, and nonlinear translating means coupled to said filter means and producing an output analog signal having reduced amplitude in response to a signal from said filter means which is below a predetermined value.

8. A communication system according to claim 7 wherein said nonlinear translating means of said delta modulator and said nonlinear translating means of said delta demodulator each includes means forming first and second signal paths connected in parallel, with said first signal path including means for inverting the signal therein to cancel a portion of the signal in said second path.

9. A communication system in accordance with claim 8 wherein said nonlinear translating means includes a transistor in said first signal path which inverts the signal, and limiting means for limiting the amplitude of the signal in said first path to a predetermined value, whereby at low signal levels the signal in said first path substantially cancel the signal in said second path, and at high signal levels the signal in said first path is limited and cancels only a portion of the signal in said second path.

* * * * *